United States Patent [19]
Takagi

[11] Patent Number: 5,969,533
[45] Date of Patent: Oct. 19, 1999

[54] PROBE CARD AND LSI TEST METHOD USING PROBE CARD

[75] Inventor: Ryoichi Takagi, Tokyo, Japan

[73] Assignee: Mitsubishi Denki Kabushiki Kaisha, Tokyo, Japan

[21] Appl. No.: 08/946,095

[22] Filed: Oct. 7, 1997

[30] Foreign Application Priority Data

May 15, 1997 [JP] Japan ................................. 9-126035

[51] Int. Cl.⁶ .................................................. G01R 1/073
[52] U.S. Cl. ............................................ 324/754; 324/761
[58] Field of Search .................................... 324/754, 765, 324/72.5, 758, 761, 762

[56] References Cited

U.S. PATENT DOCUMENTS

| | | | |
|---|---|---|---|
| 4,340,858 | 7/1982 | Malloy | 324/761 |
| 4,523,144 | 6/1985 | Okubo et al. | 324/762 |
| 4,719,417 | 1/1988 | Evans | 324/762 |
| 5,606,263 | 2/1997 | Yoshizawa et al. | 324/761 |

FOREIGN PATENT DOCUMENTS

| | | |
|---|---|---|
| 6174748 | 6/1994 | Japan . |
| 6230033 | 8/1994 | Japan . |
| 8-5662 | 1/1996 | Japan . |

*Primary Examiner*—Josie Ballato
*Assistant Examiner*—Minh Tang
*Attorney, Agent, or Firm*—Leydig, Voit & Mayer, Ltd.

[57] ABSTRACT

A probe card which solves a problem involved in conventional probe cards in that the yield of the LSIs is reduced because non-defectives can be misjudged as defectives, which is due to failure of test signal application to LSIs owing to a contact failure between probe needles and bonding pads, which in turn due to the lack of needle pressure resulting from the lack of thickness of the probe needles in the conventional probe cards. The present probe card device includes units, each of which has a plurality of probe needles juxtaposed on a first insulating sheet, and separated by second insulating sheets with a thickness of about 10 $\mu$m. The units are stacked in multilayer and fixed to a probe card substrate. The first insulating sheet has many grooves to which the second insulating sheets can be inserted. The grooves are formed on the first insulating sheet at intervals smaller than the thickness of the probe needles, and the second insulating sheets are inserted into the grooves at intervals corresponding to the thickness of the probe needles.

3 Claims, 6 Drawing Sheets

PROBE CARD AND LSI TEST METHOD USING PROBE CARD

BACKGROUND OF THE INVENTION

1. Field of the Invention

The present invention relates to a probe card used for testing semiconductor devices (called LSIs below).

2. Description of Related Art

FIG. 5 is a schematic diagram showing a configuration of a conventional semiconductor test system and a test method of an LSI using the test system. In this figure, the reference numeral 1 designates a tester, 2 designates the main body of the tester, 3 designates a test head provided in the tester 1, 4 designates an interface board 4, 5 designates a connecting ring 5, 6 designates a probe card, 7 designates probe needles attached to the probe card 6, 8 designates signal lines connecting the main body 2 of the tester with the test head 3, 9 designates POGO pins connecting the test head 3 with the interface board 4, 10 designates POGO pins connecting the interface board 4 with the connecting ring 5, and 11 designates POGO pins connecting the connecting ring 5 with the probe card 6. The reference numeral 12 designates a wafer placed on a chuck top not shown, 13 designates an LSI formed in the wafer 12, and 14 designates bonding pads formed on the LSI 13. Incidentally, although FIG. 5 shows only two probe needles 7 for the simplicity of the drawing, many probe needles are attached on the probe card 6 in practice.

The test head 3 generates test signals, and compares response signals from the LSI 13 with expected values. The main body 2 of the tester adjusts the timings of the test signals, determines the patterns of the test signals, stores the expected values, and functions as a power supply.

The conventional semiconductor test system with such an arrangement applies the test signals generated by the test head 3 to the LSI 13 through the interface board 4, connecting ring 5 and probe card 6, with the tips of the probe needles 7 contacting the bonding pads 14. The response signals from the LSI 13, on the other hand, are applied to the test head 3 through the probe needles 7, probe card 6 and connecting ring 5.

FIG. 6 is a schematic view of a conventional probe card, which schematically illustrates a cross-section passing through the center line of the probe card and perpendicular to a surface of the probe card substrate. FIG. 7 is an enlarged perspective view illustrating the A region enclosed by broken lines in FIG. 6. In these figures, the reference numeral 15 designates a probe card substrate, 16 designates a resin for fixing the probe needles 7 on the probe card substrate 15, 17 designates electrode lands disposed on the probe card substrate 15, and 18 designates an opening in the center of the probe card substrate 15. Although the electrode lands 17 are depicted only on the side of the probe card substrate 15 to which the probe needles 7 are attached in FIG. 6, they are actually attached on the opposite side of the probe card substrate 15. The electrode lands 17 attached on the side to which the probe needles 7 are attached and the electrode lands on the opposite side are connected through wires provided in the probe card substrate 15 but not shown in this figure.

The plurality of probe needles 7 of the conventional probe card 6, which are thus fixed on the probe card substrate 15 using the resin 16, have a multilayer structure in order to prevent adjacent probe needles 7 from being short-circuited. FIGS. 6 and 7 illustrate the probe needles 7 arranged in a four multilayer structure. In FIG. 7, the reference symbol 7a designates a first layer probe needle, 7b designates a second layer probe needle, 7c designates a third layer probe needle and 7d designates a fourth layer probe needle. Each probe needle is worked out in a tapered shape in such a manner that its thickness gradually reduces towards its tip, and is bent near the tip such that the tip substantially perpendicularly contacts the bonding pads 14 formed on the LSI 13. In addition, each probe needles 7 is fixed to the electrode lands 17 at its supporting end.

FIG. 8 is a schematic diagram showing the layout of the probe needles in a section taken along the line 8—8 in FIG. 6. In this figure, the reference character X designates the thickness of the probe needles 7, Y designates the gap between the adjacent probe needles 7 in the same layer, and Z designates the pitch of the bonding pads 14. The gap Y between the adjacent probe needles 7 in the same layer must be set at least about 100 $\mu$m when the probe card 6 is fabricated in the state of the art method in which the probe needles 7 are disposed manually.

In the conventional probe card 6 with such a arrangement, when the pitch Z of the bonding pads 14 is 50 $\mu$m, and the probe needles 7 have the four multilayer structure, the pitch between the probe needles 7 in the same layer becomes 4Z=200 $\mu$m. If the gap Y between the adjacent probe needles 7 in the same layer is set 100 $\mu$m in this case, the thickness of the probe needles 7 becomes 4Z−Y=100 $\mu$m. The probe needles 7 with a thickness X of 100 $\mu$m, however, cannot achieve needle pressure strong enough to break impurities such as aluminum oxide covering the surface of the bonding pads 14, even if an overdrive is applied in order to bring the tips of the probe needles 7 into contact with the bonding pads 14. This may cause a contact failure between the probe needles 7 and bonding pads 14, resulting in the failure of applying the test signals to the LSI 13. This presents a problem of misjudging a non-defective LSI device as defective, thereby reducing the yield. Such a problem arises not only with the conventional probe card 6 in which the probe needles 7 are arranged in the four multilayer structure, but also with the conventional multilayer probe card in which the thickness X of the probe needles must be set thin.

SUMMARY OF THE INVENTION

The present invention is implemented to solve the foregoing problem. It is therefore an object of the present invention to provide a probe card capable of implementing the needle pressure strong enough to break the impurities such as the aluminum oxide covering the surface of the bonding pads even if the pitch Z of the bonding pads is small.

According to one aspect of the present invention, there is provide a probe card comprising: a probe card substrate; and a plurality of units stacked in multilayer and fixed to the probe card substrate, wherein each of the plurality of units comprising: a first insulating sheet on which a plurality of probe needles are disposed; and second insulating sheets inserted between adjacent probe needles disposed on the first insulating sheet.

Here, the first insulating sheet may have multiple grooves formed in a surface, on which the probe needles are disposed, a pitch of the grooves being smaller than a thickness of the probe needles, and the second insulating sheets may be inserted in the grooves at intervals corresponding to the thickness of the probe needles.

DETAILED DESCRIPTION OF THE PREFERRED EMBODIMENT

The invention will now be described with reference to the accompanying drawings.

Figure 1:
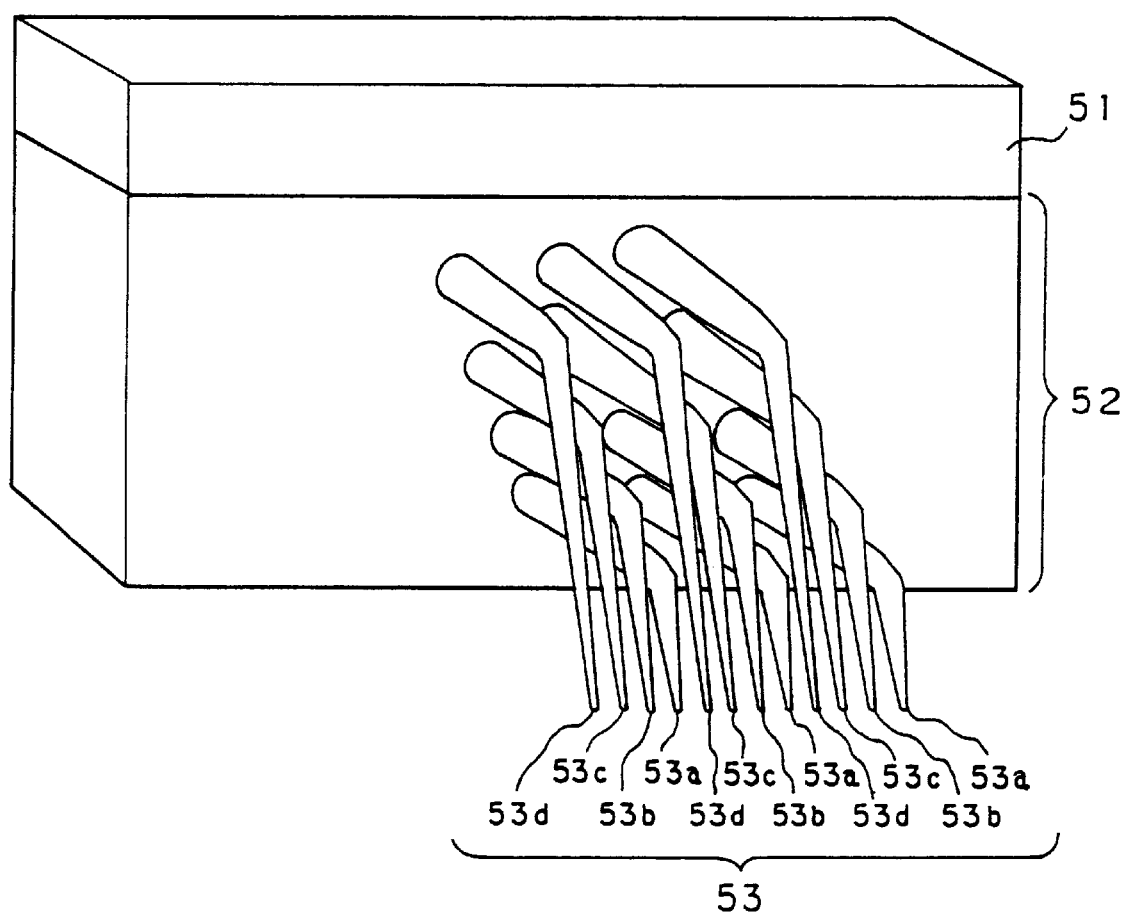
FIG. 1 is a perspective view of an embodiment of a probe card in accordance with the present invention.
Figure 6:
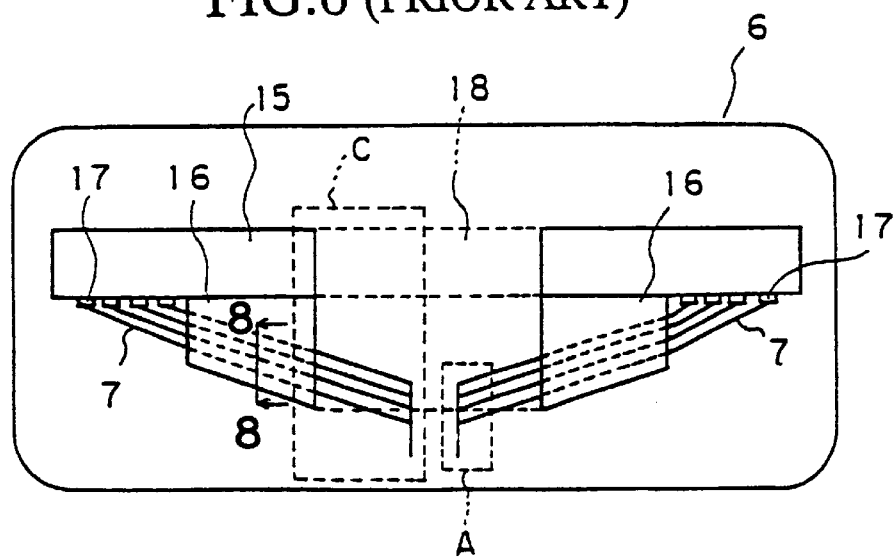
FIG. 6 is a schematic diagram showing a conventional probe card.

FIG. 1 is a schematic view of an embodiment of a probe card in accordance with the present invention, which shows, in an enlarged perspective view, a portion corresponding to the C region enclosed by broken lines in FIG. 6 showing the conventional probe card. In FIG. 1, the reference numeral 51 designates a probe card substrate, 52 designates a probe needle unit fixed to the probe card substrate 51, and 53 designates probe needles set in the probe needle unit 52. FIG. 1 shows 12 probe needles 53 set in the probe needle unit 52. The 12 probe needles 53 have a multilayer structure to prevent the adjacent probe needles 53 from being short-circuited. In FIG. 1, the probe needles 53 are arranged in four layers, in which the reference symbol 53a designates first layer probe needles, 53b designates second layer probe needles, 53c designates third layer probe needles and 53d designates fourth layer probe needles. Each probe needle is worked out in a tapered shape in such a manner that its thickness gradually reduces towards its tip, and is bent near the tip such that the tip perpendicularly contacts the bonding pads formed in the LSI. In addition, each probe needle 53 is connected to the electrode land at its supporting end.

Next, a fabrication method of the embodiment of the probe card will be described referring to FIGS. 2A–4 illustrating the fabrication method of the embodiment of the probe card.

Figure 2A:
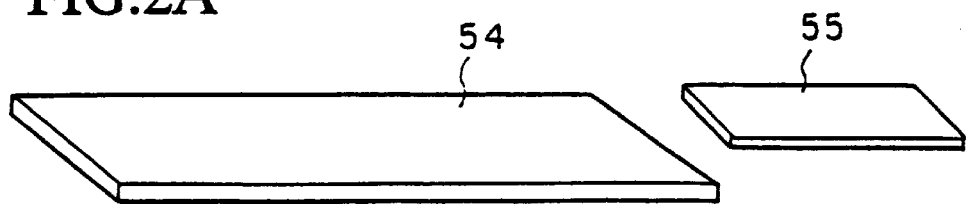
FIGS. 2A–2C and 3A are perspective views illustrating a fabrication process of the embodiment of the probe card in accordance with the present invention.

For fabricating the embodiment of the probe card, two types of insulating sheets 54 and 55 are prepared first as shown in FIG. 2A. As will be described in connection with a post-process, the first insulating sheet 54 is used for supporting the probe needles 53 disposed thereon, and the second insulating sheets 55 are used for preventing the probe needles 53 from contacting each other on the first insulating sheet 54. Thus, the first insulating sheet 54 can have a thickness of about a few hundred micrometers which will provide considerable rigidity, and the second insulating sheets 55 can have a thickness of about 10 $\mu$m which will achieve enough insulation between adjacent probe needles 53.

In addition, since the chuck top is sometimes heated up to 100–150° C. for testing the LSI, the first insulating sheet 54 and second insulating sheets 55 must endure the temperature of about 150° C. in order to bear the heat radiated from the chuck top. Taking account of this, a ceramic substrate or glass epoxy substrate can be employed as the first and second insulating sheets 54 and 55, for example. A substrate made of alumina or aluminum nitride can be used as the ceramic substrate, and a substrate using epoxy resin or polyimide resin can be employed as the glass epoxy substrate. Furthermore, the second insulating sheets 55 are used which are taller than half the thickness of the probe needle 53 disposed on the first insulating sheet 54, when the second insulating sheets 55 are fixed to the first insulating sheet 54.

Figure 2B:
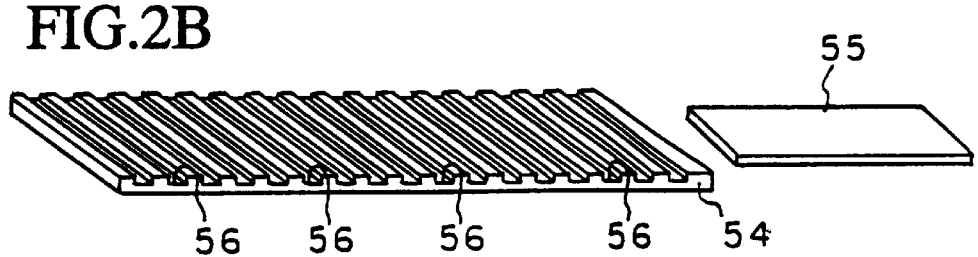

Subsequently, multiple grooves 56 to which the second insulating sheets 55 are to be inserted are formed on the first insulating sheet 54 by a cutting process using a diamond cutter or the like as shown in FIG. 2B. The grooves 56 are formed in the side, on which the probe needles 53 are disposed, at intervals smaller than the thickness of the probe needle 53, at intervals of 20 $\mu$m, for example. The width of the grooves is equal to the thickness of the second insulating sheets 55.

Figure 2C:
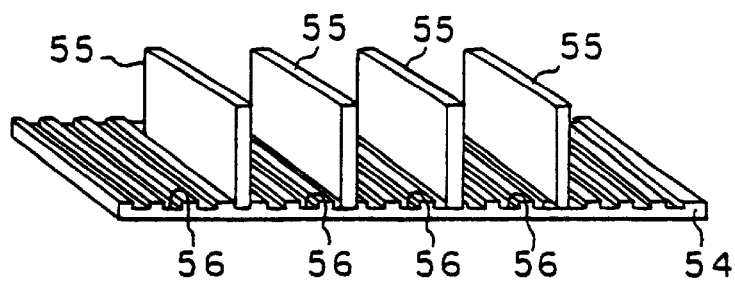

Afterward, the second insulating sheets 55 are inserted into the grooves 56 formed in the first insulating sheet 54 as shown in FIG. 2C in such a manner that the intervals between the second insulating sheets 55 are about the same as the thickness of the probe needles 53 disposed on the first insulating sheet 54. Thus, the second insulating sheets 55 are fixed to the first insulating sheet 54 as shown in FIG. 2C illustrating four second insulating sheets 55 fixed to the first insulating sheet 54.

Figure 3A:
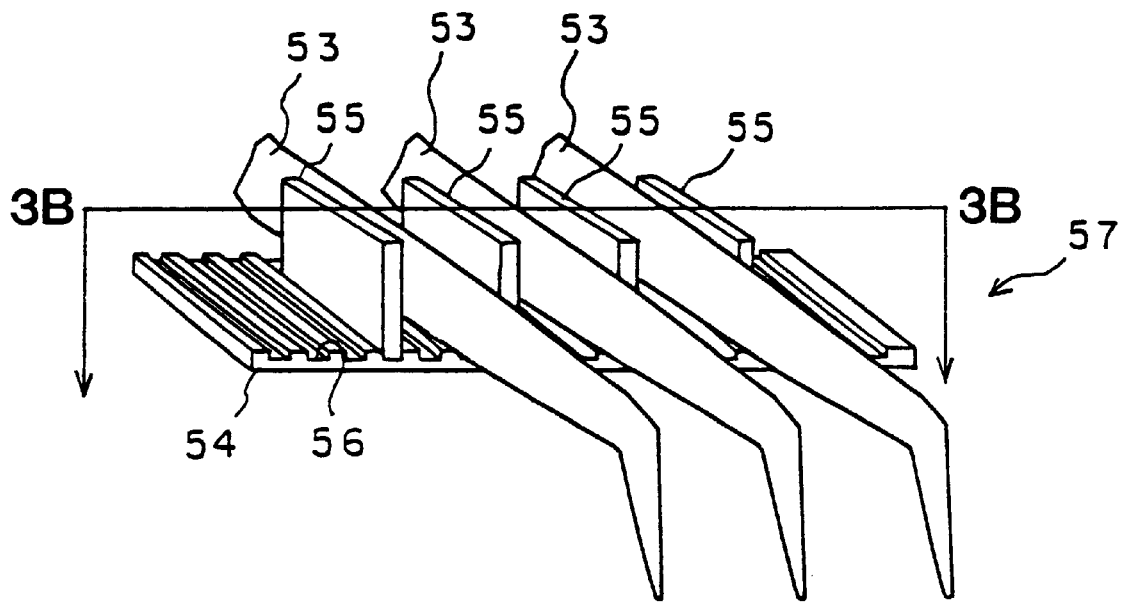
Figure 3B:
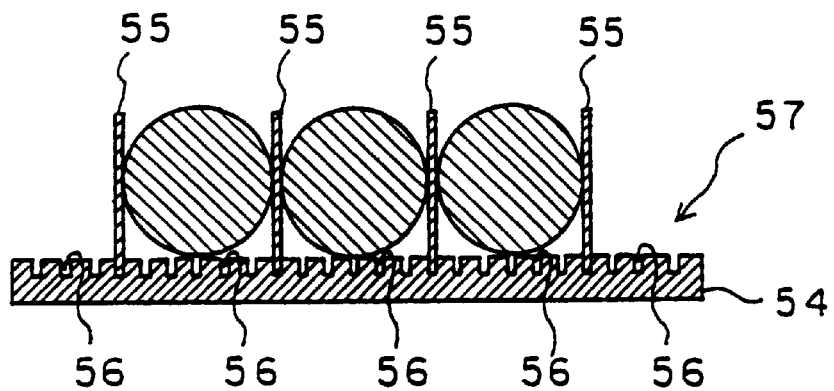
FIGS. 3B is a cross-sectional view taken along the line 3B—3B of FIG. 3A.

Subsequently, the probe needles 53 are disposed on the first insulating sheet 54 as shown in FIGS. 3A and 3B in such a manner that they are juxtaposed between second insulating sheets 55. FIGS. 3A and 3B illustrate the case in which three probe needles 53 are disposed on the first insulating sheet 54. FIG. 3B is a cross-sectional view taken along the line 3B—3B of FIG. 3A. Thus, a unit 57 has been completed through the process described above.

Figure 4:
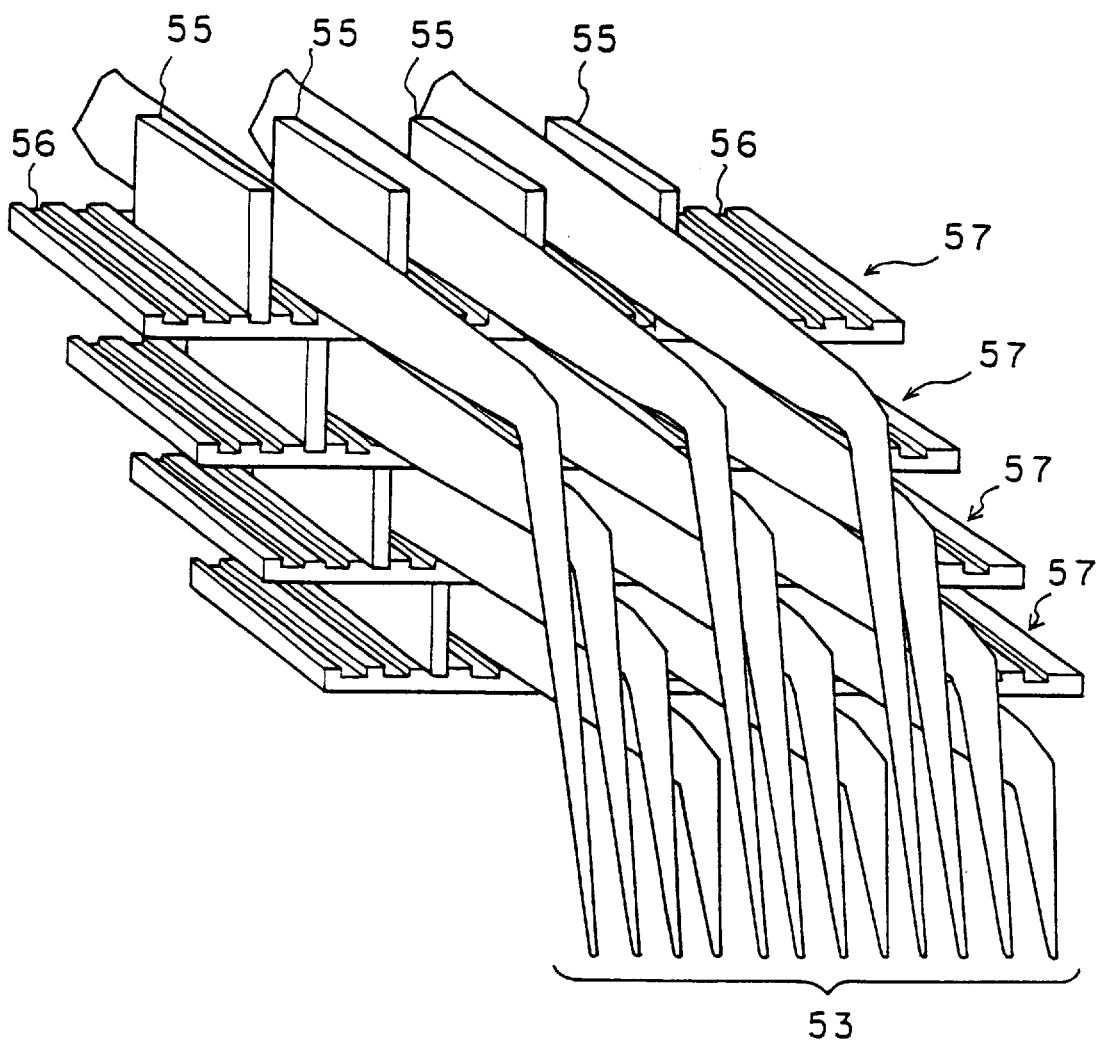
FIG. 4 is a perspective view illustrating the embodiment of the probe card which has been completed through the process of FIGS. 2A—3A.
Figure 5:
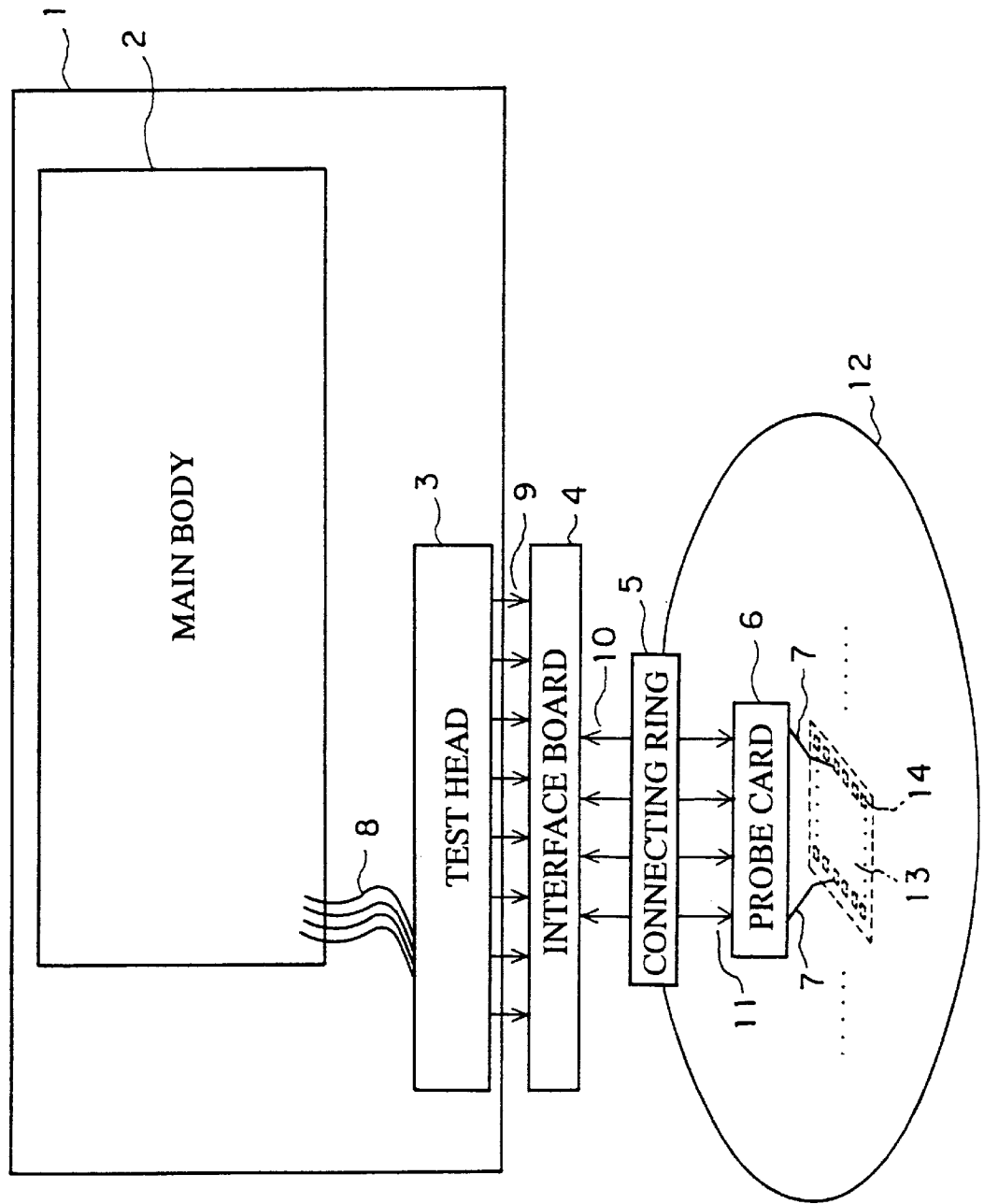
FIG. 5 is a block diagram showing a schematic configuration of a conventional semiconductor test device.
Figure 7:
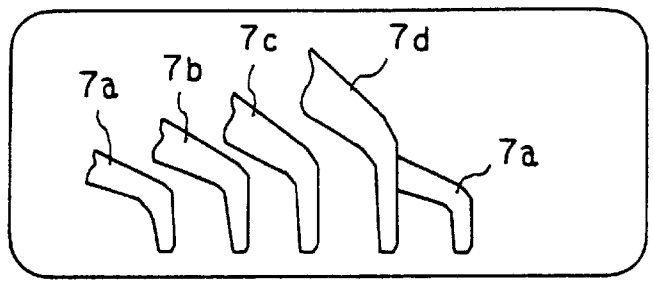
FIG. 7 is an enlarged diagram illustrating a neighborhood of the tips of probe needles attached to the conventional probe card.
Figure 8:
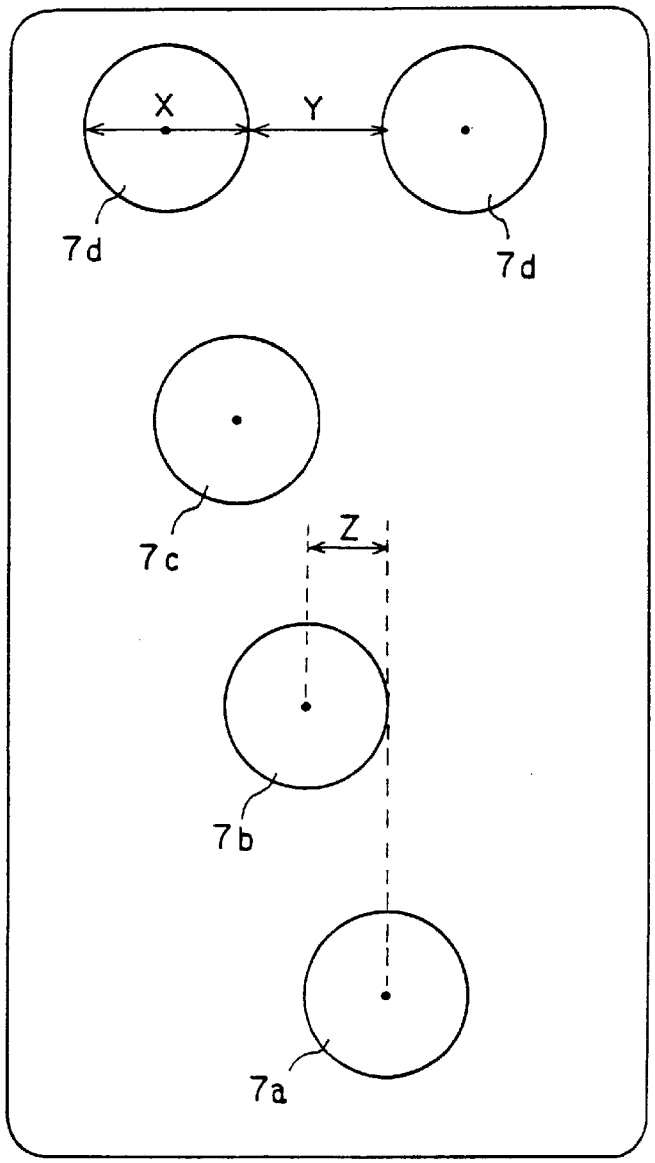
FIG. 8 is a diagram illustrating the relationships of the positions of the probe needles attached to the conventional probe card.

Afterward, the units 57 are stacked in a multilayer as shown in FIG. 4 in such a manner that the probe needles 53 do not contact one another, and the tips of the probe needles 53 have a fixed pitch. FIG. 4 illustrates the case where the units 57 are stacked in four layers. The length of tip portions beyond the bends of the probe needles 53 differ from layer to layer.

After that, the stack of the units 57 are fixed by a resin which is injected into spaces between the first insulating sheet 54 and second insulating sheets 55. Thus, the probe needle unit 52 is completed through the process described above.

Subsequently, the probe needle unit 52 is fixed to the probe card substrate 51 with adhesive or the like, and the supporting ends of the probe needles 53 are connected to the electrode lands formed on the probe card substrate 51. The probe card is completed through the above-described process.

As seen from the foregoing fabrication method, the embodiment of the probe card is built by fixing to the probe card substrate 51 the probe needle unit 52 formed by stacking in multilayer the units 57, each of which has such a structure that the plurality of the probe needles 53, which are separated from one another by the second insulating sheets 55 with a thickness of about 10 $\mu$m, are disposed on the first insulating sheet 54. The first insulating sheet 54 has on its side, on which the probe needles 53 are disposed, many grooves 56 into which the second insulating sheets 55 are to be inserted. The grooves 56 are formed at intervals smaller than the thickness of the probe needles 53, and the second insulating sheets 55 are inserted in the grooves 56 at about the same intervals of the thickness of the probe needles 53.

As described above, according to the embodiment, the gap between the adjacent probe needles 53 in the same layer can be reduced to about 10 μm, the thickness of the second insulating sheets 55. In addition, even if the pitch of the bonding pads is 50 μm, the thickness of the probe needles can be set at about 190 μm when they are stacked in four layers. The 190 μm thick probe needles can achieve needle pressure strong enough to break the impurities like aluminum oxide covering the surface of the bonding pads when the probe needles 53 are overdriven to ensure that their tips contact the banding pads. This can prevent the contact failure between the probe needles 53 and bonding pads 14, which in turn offers an advantage of implementing effective test of LSIs.

Furthermore, since the first insulating sheet 54 has many grooves 56, to which the second insulating sheets 55 can be inserted, at intervals smaller than the thickness of the probe needles 53, at every 20 μm interval, for example, the second insulating sheets 55 can be inserted into the grooves 56 in accordance with the thickness of the probe needles 53, which has an advantage of increasing choices of the thickness of the probe needles 53.

Moreover, since the probe needles 53 are disposed between the second insulating sheets 55 fixed to the grooves 56 formed in the first insulating sheet 54, the manual positioning adjustment becomes unnecessary. This has an advantage of facilitating the fabrication of the probe card.

Although it is assumed in the foregoing embodiment that the thickness of the second insulating sheets 55 are about 10 μm, the pitch of the grooves 56 formed in the first insulating sheet 54 is about 20 μm, and the unit 57 is stacked in four layers, this is a mere example, and the present invention is not limited to such an example.

What is claimed is:

1. A probe card comprising:
   a probe card substrate; and
   a plurality of units stacked in layers and fixed to said probe card substrate, wherein each of said units comprises:
   a first insulating sheet including a plurality of grooves;
   a plurality of probe needles disposed on said first insulating sheet, each of said probe needles having a thickness, the grooves having a pitch smaller than the thickness of the probe needles; and
   second insulating sheets inserted in grooves in said first insulating sheet at intervals corresponding to the thickness of said probe needles and between adjacent pairs of probe needles.

2. A method of testing an LSI device using a probe card comprising a probe card substrate, and a plurality of units stacked in layers and fixed to the probe card substrate, wherein each of the units comprises a first insulating sheet including a plurality of grooves, a plurality of probe needles disposed on the first insulating sheet, the probe needles having a thickness larger than a pitch of the grooves, and second insulating sheets inserted in the grooves between adjacent pairs of probe needles, the method comprising:
   contacting a plurality of bonding pads on an LSI device with said probe needles;
   transmitting test signals to said LSI device through said probe needles;
   receiving response signals from the LSI device through said probe needles; and
   comparing the response signals to expected values to determine whether the LSI device is defective.

3. The method as claimed in claim 2 wherein each of said probe needles has a tapered shape, a pointed tip, and a bend between the first insulating sheet and the pointed tip.

* * * * *